US006506451B1

(12) United States Patent
Stubhan et al.

(10) Patent No.: US 6,506,451 B1
(45) Date of Patent: Jan. 14, 2003

(54) COMPOSITE STRUCTURE AND PROCESS FOR PRODUCING IT

(75) Inventors: Frank Stubhan, Ehingen (DE); Hans-Juergen Fuesser, Dettingen (DE); Mona Ferguson, Ulm (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 08/647,318

(22) Filed: May 9, 1996

Related U.S. Application Data

(62) Division of application No. 08/512,273, filed on Aug. 7, 1995, now abandoned.

(30) Foreign Application Priority Data

Aug. 5, 1994 (DE) .......................................... 44 27 714

(51) Int. Cl.$^7$ .............................................. C23C 16/26
(52) U.S. Cl. ............................... 427/249.7; 427/249.8; 427/249.11; 427/533
(58) Field of Search ................................ 427/249, 122, 427/533, 307, 249.7, 249.8, 249.11

(56) References Cited

U.S. PATENT DOCUMENTS 5,145,712 A  *  9/1992  Jesser et al. ................. 427/249

5,424,096 A  *  6/1995  Anthony et al. ............. 427/249

FOREIGN PATENT DOCUMENTS

JP          06-172088       *   6/1994

OTHER PUBLICATIONS

Dotty et al, Journal of Electronic Materials, vol. 20, No. 2, 1991, pp. 121–126.*
Meilunas et al, Appl. Phys. Lett. 59(26) Dec. 1991, pp. 3461–3463.*

* cited by examiner

*Primary Examiner*—Bret Chen
(74) *Attorney, Agent, or Firm*—Crowell & Moring LLP

(57) ABSTRACT

A composite structure having a substantially monocrystalline growth substrate and at least one monocrystalline or polycrystalline layer of diamond or diamond-like material arranged on a surface of the growth substrate, the surface of the growth substrate being provided with crystal growth nuclei having crystal axes which exhibit an inclination of not more than 10%, preferably not more than 7%, with respect to corresponding axes of the crystal lattice of the growth substrate, and a process for producing such a composite structure in which the growth substrate is pretreated and growth nuclei are deposited from a nucleating gas phase of known composition for depositing layers of diamond or diamond-like material, in which during the nucleation the growth substrate is raised to a negative electrical potential relative to the nucleating gas phase.

9 Claims, 1 Drawing Sheet

COMPOSITE STRUCTURE AND PROCESS FOR PRODUCING IT

This application is a division of application Ser. No. 08/512,273, which was filed on Aug. 7, 1995, now abandoned.

BACKGROUND OF THE INVENTION

This invention relates to a composite-structure comprising a substantially monocrystalline growth substrate with at least one monocrystalline or polycrystalline layer of diamond or diamond-like material arranged thereon and to a process for producing such a composite structure.

U.S. Pat. No. 5,082,359 discloses a process for producing a polycrystalline diamond layer on, for example, a silicon substrate. Prior to the deposition of the diamond layer, for example, by means of a hot wire CVD (Chemical Vapor Deposition) process described in JP 62-278,196, the free surface of the silicon substrate is pretreated to intentionally generate irregularities on the free surface. These irregularities, which destroy the smooth structure of the free surface (for example: craters, fissures or cracks, etc.), can be introduced into the free surface by means of chemical etching or plasma etching, by means of at ion beam, by means of a laser, etc. Powdered diamond crystals from an external source are subsequently embedded in these disturbances or irregularities, in particular by being rubbed in. The embedded diamond crystals then can serve as growth crystals for the diamond layer which is deposited after the embedding of the individual powdered diamond crystals. This nucleation of the free surface, however, is both very labor-intensive and cost-intensive. Furthermore, the deposited polycrystalline diamond layer of the composite structure only exhibits a small degree of orientation relative to the crystal lattice of the growth substrate. As a result of this limited orientation, the diamond layer is only suitable to a limited extent for subsequent application of electronic components and/or for epitaxial growth of a further layer, in particular a semiconductor layer, since this low orientation of the diamond layer adversely affects the function of the components and/or the quality of the further crystal layer.

SUMMARY OF THE INVENTION

The object of the invention is to further develop the basic composite structure to such an extent that it is better suited for application of electronic components.

Another object of the invention is to improve the basic composite structure so that it is better suited for epitaxial deposition of subsequent crystalline layers, in particular semiconductor layers.

A further object of the invention is to provide a process for producing a composite structure of the foregoing type with which such composite structures can be produced as simply and inexpensively as possible.

These and other objects have been achieved in accordance with the present invention by providing a composite structure comprising a substantially monocrystalline growth substrate having a crystal lattice, and at least one monocrystalline or polycrystalline layer of diamond or diamond-like material deposited on a surface of the growth substrate, in which the surface of said growth substrate is provided with crystal growth nuclei, at least 50% of the growth nuclei having crystal axes exhibiting not more than 10% inclination relative to corresponding axes of the growth substrate crystal lattice.

In accordance with a further aspect of the invention, the objects have also been achieved by providing a process for producing a composite structure comprising a growth substrate and at least one monocrystalline or polycrystalline layer of diamond or diamond-like material arranged on a surface of the growth substrate, which process comprises depositing crystal growth nuclei on the surface of the growth substrate by chemical vapor deposition from a nucleating gas phase comprising a diamond precursor, the growth substrate having a negative electrical potential applied thereto relative to the nucleating gas phase, and then depositing said layer of diamond or diamond-like material on the surface provided with growth nuclei by means of hot wire chemical vapor deposition from a depositing gas phase.

By means of the "in-situ" nucleation of growth nuclei on the growth substrate in accordance with the invention, the subsequent deposition of the diamond layer thereon is effected with a good orientation of the diamond layer.

BRIEF DESCRIPTION OF THE DRAWINGS

The invention will be described in further detail hereinafter with reference to illustrative preferred embodiments depicted in the accompanying drawings in which.

DETAILED DESCRIPTION OF PREFERRED EMBODIMENTS

Figure 1:
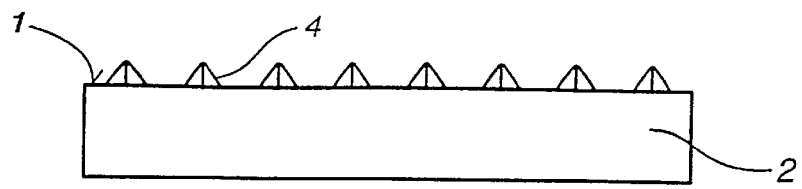
FIG. 1 shows an enlargement of a section through a growth substrate nucleated with growth nuclei for a composite structure in accordance with the invention.

In FIG. 1, an enlargement of a section through a growth substrate 2 nucleated with growth nuclei 4 for a composite structure 7 in accordance with the invention is illustrated. The growth substrate may be comprised of any of the substrate materials known in the art, such as silicon, cubic boronitride, silicon carbide, etc. For reasons of cost and availability it is preferred to use silicon a growth substrate in the present invention. The growth substrate 2, which has a substantially smooth surface, has growth nuclei 4 on its free surface which in the composite substrate 7 forms a boundary surface 1 between the growth substrate 2 and the diamond layer 3. The growth nuclei 4, which have a density of between $10^7$ and $10^{11}$ growth nuclei per $cm^2$, are of diamond and/or a diamond-like material, such as diamond-like carbon, the diamond layer and arranged approximately uniformly distributed over the surface which subsequently becomes the boundary surface 1.

Figure 2:
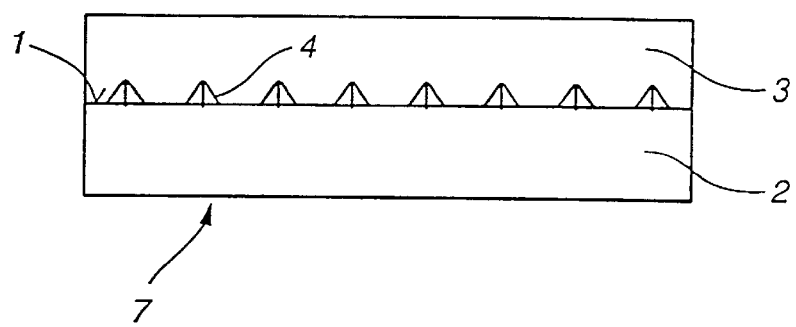
FIG. 2 shows an enlargement of a section through a composite structure in accordance with the invention.

In FIG. 2, an enlargement of a section through a composite structure 7 in accordance with the invention is illustrated which has a diamond layer 3 deposited on a nucleated growth substrate 2 of crystalline silicon in accordance with FIG. 1. The diamond layer 3 is grown substantially heteroepitaxially, which means that the growth of the deposited diamond crystal is oriented by the lattice of the silicon growth substrate. Consequently, the axes of the crystal lattice of the substantially heteroepitaxially grown diamond layer 3 are inclined by at most 10°, in particular by at most 7°, with respect to the corresponding axes of the crystal lattice of the growth substrate 2. This results from the fact that the diamond layer grows correspondingly to the orientation of the growth nuclei, whereby the crystal axes of the growth nuclei are inclined in accordance with the foregoing values with respect to the corresponding crystal axes of the growth substrate 2. Thus, the orientation of the crystal lattice is achieved by transfer of crystal information from the crystalline growth substrate, or in other words, by a so-called epitaxy process.

Figure 3:
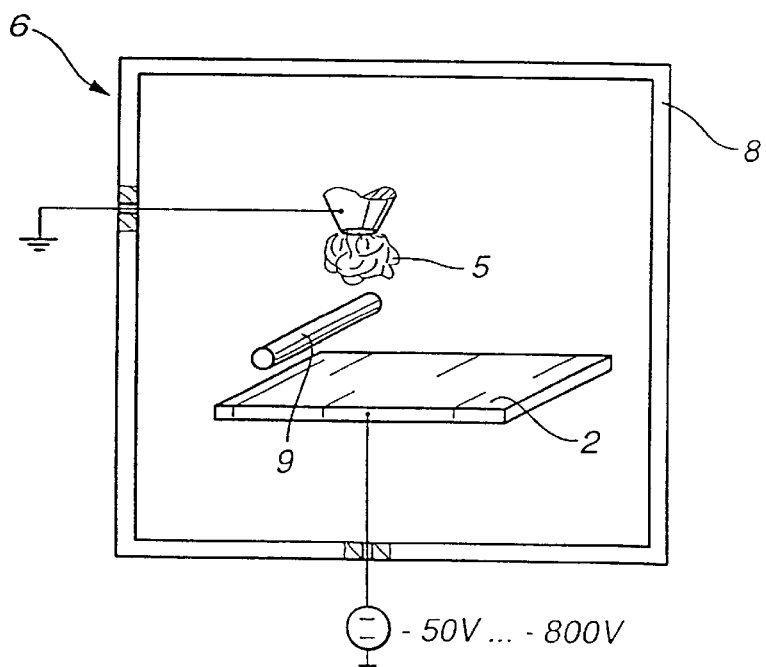
FIG. 3 shows an apparatus for producing the composite structure of the invention.

In the following, a process is described for producing a composite structure 7 in accordance with the invention. In the instant process, a growth substrate 2 is arranged in a reactor 8 of an apparatus 8 for deposition of diamond layers 3, particularly of a CVD installation in accordance with FIG. 3, on a substrate holder (not shown). In conjunction with this process, the growth substrate 2 may be pretreated outside of the reactor 8, but also may first be pretreated inside the reactor 8.

As noted above, prior to depositing the growth nuclei on the growth substrate, the substrate may be pretreated and/or cleaned by methods conventional in the art, for example, for removing oils, oxides or other contaminants from the surfaces of silicon wafers. Such pretreatments may comprise, for example, heating in KOH solution and/or treatment with ultrasonic energy and/or etching with hydrofluoric acid and/or rinsing with ultradistilled water (having an electrical resistance of about 16 Mega-Ohm). One particularly suitable pretreatment or cleaning process is disclosed in published PCT Application No. WO 94/08,076, the disclosure of which is incorporated herein by reference.

After the known pretreatment of the growth substrate 2, which also cleans the substrate, in which contaminants such as oxides, etc. are removed from the free surface of the growth substrate 2 which subsequently forms the boundary surface of the composite structure 7, growth nuclei 4 are deposited "in-situ" on the subsequent boundary surface 1 of the composite structure 7 from a nucleating gas phase 5 which has a known composition for depositing a diamond layer 3, referred to hereinafter as precursor material. Suitable precursor materials are known in the art; for example from U.S. Pat. Nos. 5,082,359; 5,114,696; 5,186,765 or published PCT application No. WO 94/08,076, the disclosures of which are incorporated herein by reference. The growth nuclei 4 deposited "in-situ" are expediently formed of diamond and/or a diamond-like material, such as diamond-like carbon.

During the nucleation, which advantageously is carried out at pressures between 10 Pa and 30,000 Pa, the nucleating gas phase 5 and optionally the growth substrate 2 are heated and a negative electrical potential relative to the nucleating gas phase 5, is applied to the growth substrate 2. This may be meaningfully effected by grounding all electrically conductive parts which come into contact with the depositing gas phase 5 and applying a negative potential relative to the ground to the growth substrate 2.

In order to avoid ion implantation, the applied voltages preferably amount to less than –800 V, but more than –50 V. Values between –150 V and –400 V have proved particularly advantageous. The heating of the nucleating gas phase 5 or of the growth substrate 2 is meaningfully carried out by means of a heat source arranged above the growth substrate 2, particularly by means of a heating wire 9 of a hot wire CVD extending over the surface of the growth substrate 2. A hot wire chemical vapor deposition apparatus such as that disclosed in published Japanese patent application No. JP 62-278,196-A may suitably be used for this purpose. For clarity of illustration in FIG. 3, the electrical supply lines of the heating wire 9 have been omitted from the figure.

After the nucleation in sufficient density, the diamond layer 3 is deposited by means of a known hot wire-CVD (chemical vapor deposition), whereby the electric field between the growth substrate 2 and the depositing gas phase 5 is advantageously switched off.

The layers of diamond or diamond-like material produced in accordance with the present invention may be either monocrystalline or polycrystalline. For example, a monocrystalline layer may be produced if the nucleation is carried out using a monocrystalline growth substrate under conditions such that the crystal information for the growth nuclei is passed from the monocrystalline growth substrate to the nuclei as they form so that the nuclei have an essentially uniform crystal orientation.

In the following, some process parameters are given for producing the desired composite structure 7 from hydrocarbon precursor materials such as disclosed in, published PCT application No. WO 94/08,076, the disclosure of which is incorporated herein by reference. At a spacing of the heating wire 9 of about 30 mm, a voltage of about –275 V is applied to the growth substrate 2. As gas pressure for the precursor material, approximately 7 Torr is applied with a nozzle having an opening diameter of 4 mm, so that a gas flow of about 30 sccm results.

Depending on the spacing of the heating wire 9, a gas flow velocity deviating from the above value may yield a better nucleation. One should proceed from the basic rule that larger spacing between the heating wire 9 and the growth substrate 2 requires a higher gas flow rate.

The foregoing description and examples have been set forth merely to illustrate the invention and are not intended to be limiting. Since modifications or the disclosed embodiments incorporating the spirit and substance of the invention may occur to persons skilled in the art, the invention should be construed to include everything within the scope of the appended claims and equivalents thereof.

What is claimed is:

1. A process for producing a composite structure comprising a substrate and at least one monocrystalline or polycrystalline layer of diamond or diamond-like material arranged on a surface of the substrate, said process comprising depositing crystal growth nuclei on said surface of the substrate by chemical vapor deposition from a nucleating gas phase comprising a diamond precursor, said substrate having a negative electrical potential applied thereto relative to said nucleating gas phase, and then depositing said layer of diamond or diamond-like material on said surface provided with growth nuclei by means of hot filament chemical vapor deposition from a depositing gas phase.

2. A process according to claim 1, wherein said process further comprises pretreating said surface of said substrate prior to providing said growth nuclei thereon.

3. A process according to claim 1, further comprising heating said nucleating gas phase during the deposition of said growth nuclei.

4. A process according to claim 3, further comprising heating the substrate during the deposition of said growth nuclei.

5. A process according to claim 1, wherein the nucleating gas phase and the substrate are heated by a heating wire arranged above the substrate.

6. A process according to claim 1, wherein the deposition of the growth nuclei is carried out at a pressure of from 10 Pa to 30,000 Pa.

7. A process according to claim 1, wherein said negative electrical potential is applied to the substrate by grounding conductive parts of a chemical vapor deposition apparatus used to deposit the growth nuclei which parts contact the nucleating gas phase, and then applying a negative voltage relative to the ground to the substrate.

8. A process according to claim 1, wherein the negative electrical potential applied to the substrate has a voltage in the range from –50 V to –800 V relative to the gas phase.

9. A process according to claim 8, wherein the negative electrical potential applied to the substrate has a voltage in the range from –150 V to –400 V relative to the gas phase.

* * * * *